United States Patent [19]
Pelly

[11] Patent Number: 5,923,513
[45] Date of Patent: Jul. 13, 1999

[54] ACTIVE SNUBBER DEVICE FOR POWER MODULES

[75] Inventor: Brian Pelly, Palos Verdes Estates, Calif.

[73] Assignee: International Rectifier Corp., El Segundo, Calif.

[21] Appl. No.: 08/782,570

[22] Filed: Jan. 10, 1997

[51] Int. Cl.⁶ .................................................. H02H 3/20
[52] U.S. Cl. .................. 361/90; 361/91; 361/92
[58] Field of Search .............. 361/56, 91, 111, 361/54, 13, 90; 363/50, 52–58

[56] References Cited

U.S. PATENT DOCUMENTS

| 4,697,219 | 9/1987 | Mitsuoka | 361/91 |
| 4,700,256 | 10/1987 | Howell | 361/13 |
| 5,436,786 | 7/1995 | Pelly et al. | 361/56 |

*Primary Examiner*—Sally C. Medley
*Attorney, Agent, or Firm*—Ostrolenk, Faber, Gerb & Soffen, LLP

[57] ABSTRACT

A snubber device for a power switch comprising a sensing device coupled in the output circuit of the power switch, the sensing device having a reference input and providing an output indicating if a transient pulse of a magnitude greater than a preset range occurs in the output circuit of the power switch. A further electronic switch is provided having an input coupled to an output of the sensing device and coupled across the power switch, the further electronic switch being turned on by the sensing device in the event the sensing device detects a transient pulse beyond the preset range, thereby completing a shunt circuit across the electronic switch and dissipating the transient pulse.

16 Claims, 3 Drawing Sheets

ACTIVE SNUBBER DEVICE FOR POWER MODULES

BACKGROUND OF THE INVENTION

The present invention relates to transient suppression devices, and in particular, to transient suppression snubber devices for power supply circuits. In particular, the present invention relates to an active snubber device for power modules, for example, power modules having power switching transistors such as insulated gate bipolar (IGBT) power transistors.

In the past, snubbers for power modules have included passive devices using large components to dissipate energy, often continuously. For example, in power transistor switching circuits, passive components comprising resistors, capacitors and diodes have been used to snub out transient spikes created from switching inductive loads or due to the internal inductive energy of the power switching devices themselves.

FIG. 1 shows an example of such a prior art snubber. As shown in FIG. 1, an insulated gate bipolar transistor (IGBT) 1 is provided with a control signal at its gate which controls the switching of a load coupled into the emitter collector circuit. If the load is inductive or due to the stray inductance, when the IGBT switches, voltage spikes are produced. A snubber is provided in the circuit of FIG. 1 comprising a capacitor 2, diode 4 and resistor 6. The snubber circuit, as well known in the art, absorbs transients and other spikes. However, although performing this function very well, the passive snubber circuit typically comprises very large capacitances and resistances which present problems with respect to cost, space saving designs and miniaturization.

SUMMARY OF THE INVENTION

It is accordingly, an object of the present invention to provide a new type of snubber circuit for snubbing out transients and spikes in power switching circuits.

It is a further object of the invention to provide a snubber circuit of low cost and which is space saving.

It is still a further object of the invention to provide such a snubber circuit which uses an active device for snubbing out transients.

The above and other objects of the present invention are achieved by a snubber device for a power switch comprising a sensing device coupled in an output circuit of the power switch, the sensing device having a reference input and providing an output indicating if a transient pulse of a magnitude greater than a preset range occurs in the output circuit of said power switch; and a further electronic switch having an input coupled to an output of said sensing device and coupled across said power switch, the further electronic switch being turned on by said sensing device in the event said sensing device detects a transient pulse beyond said preset range, thereby completing a shunt circuit across the electronic switch and dissipating said transient pulse.

Other features and advantages of the present invention will become apparent from the following description of the invention which refers to the accompanying drawings.

BRIEF DESCRIPTION OF THE DRAWINGS

The invention will now be described in greater detail in the following detailed description with reference to the drawings, in which.

DETAILED DESCRIPTION OF EMBODIMENTS OF THE INVENTION

Figure 1:
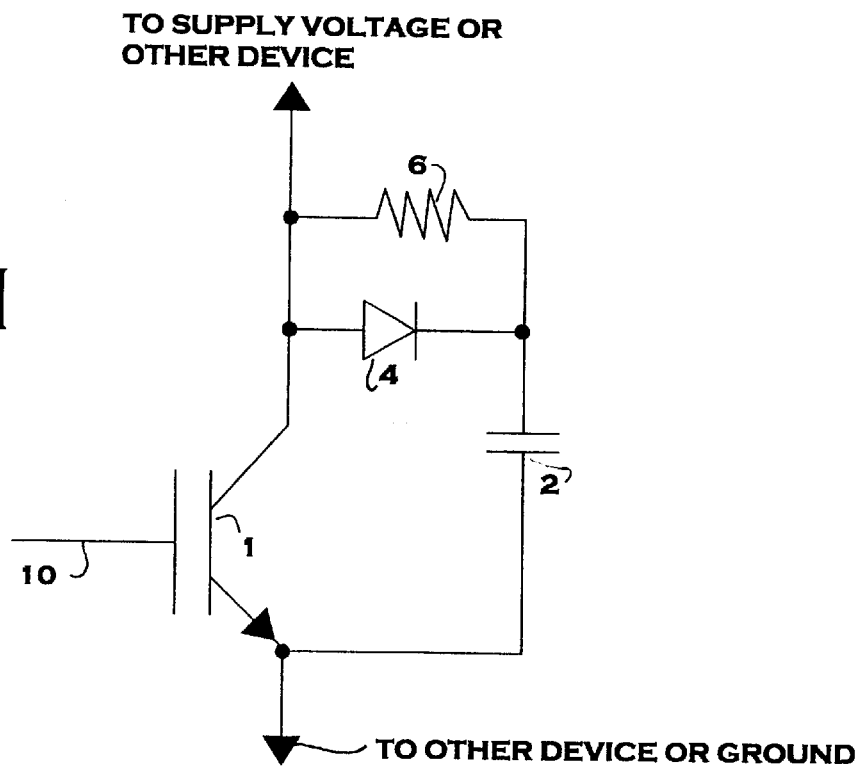
FIG. 1 shows a prior art snubber circuit.
Figure 2:
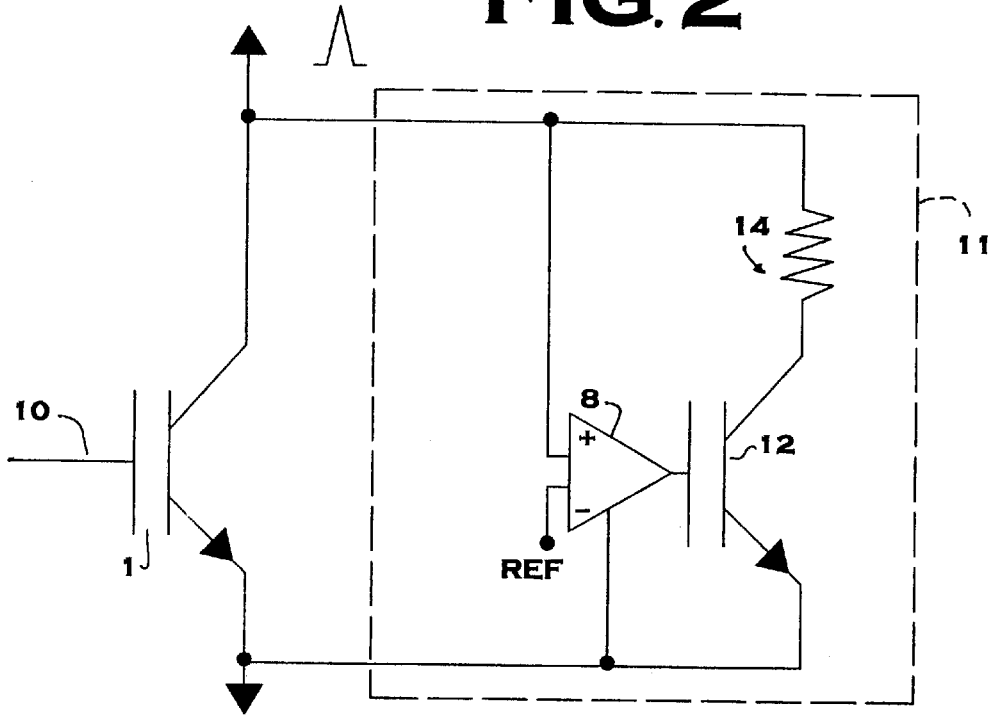
FIG. 2 shows the active device snubber circuit according to the present invention.

With reference now to FIG. 2, an IGBT 1 is shown having a control input 10. Other power switching devices could also be used, e.g., bipolar transistors, MOSFETs etc. The output (collector-emitter) circuit of the IGBT is coupled so as to switch a load, not shown. The active snubber device according to the present invention is shown at 11 is connected across the collector-emitter circuit of the switching device, e.g., IGBT 1. The device 11 includes a comparator 8, having a reference input coupled to a reference voltage source and the other input coupled to a power electrode of the electronic switch 1. In the illustrated embodiment, the two inputs of the comparator 8 are connected respectively to the reference voltage source and the collector of the IGBT electronic switch 1. An output of the comparator is connected to a further electronic switch 12, which can comprise a low power IGBT. The collector of the IGBT 12 is coupled through a voltage reducing resistor 14 to the collector of the power electronic switch 1. The emitter of switch 12 is connected to the emitter of the power electronic switch 1.

In operation, when the comparator 8 senses a voltage on its non-inverting input which exceeds the preset level determined by the voltage on the reference input of the comparator 8, the comparator turns on, turning on the further electronic switch 12, which is disposed in series with resistor 14 in shunt across the power switch 1. Switch 12 turns on and, in combination with resistor 14, dissipates the voltage spike. The resistor 14 is thus provided to reduce the voltage level across the further electronic switch 12 to prevent damaging it.

In the embodiment shown, the further electronic switch comprises a low power IGBT. However, other electronic switches could also be employed. It is important that the comparator 8 and the electronic switch 12 have adequately fast response times so as to be able to dissipate a voltage spike or transient before it can damage the power switch 1 or any other circuit component or the load connected to the power switch 1. When the further electronic switch 12 conducts, essentially the resistance 14 is shunted across the power switch 1, thereby dissipating the energy of the transient pulse. The circuit of FIG. 2 can therefore control the rise time of voltage spikes, i.e. the dv/vt and the amplitude of the voltage spikes.

Figure 4:
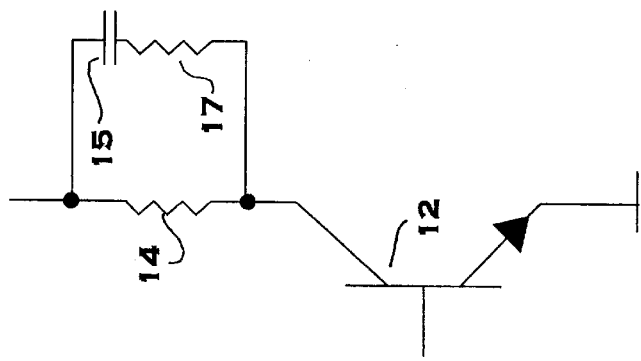
FIG. 4 shows how dv/dt control may be accomplished.

For dv/dt control, it may be necessary to add a capacitor 15, or capacitor 15/resistor 17 across resistor 14, as shown in FIG. 4.

Figure 5:
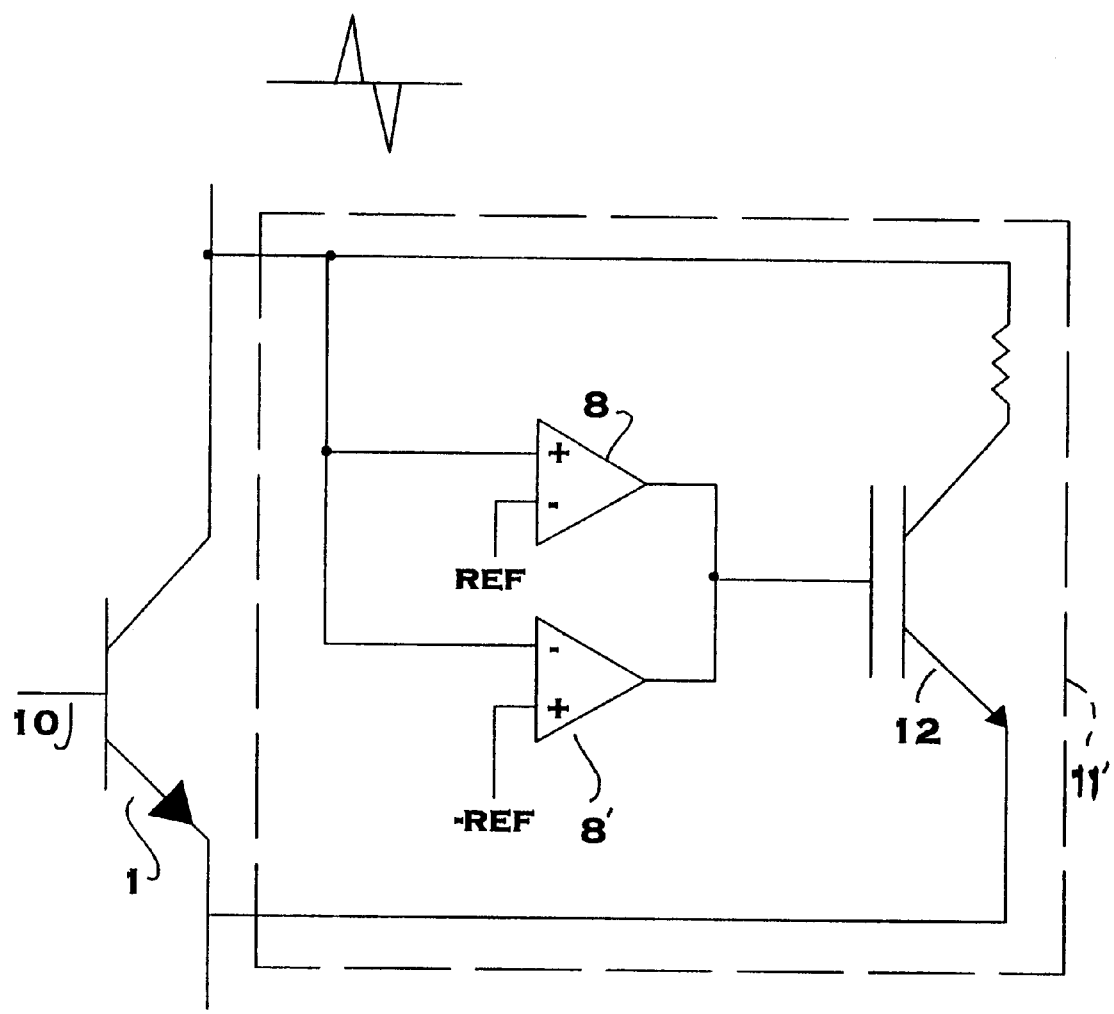
FIG. 5 shows an active device snubber circuit according to another aspect of the present invention.

In the embodiment shown, a snubber circuit has been provided which can dissipate positive going transients. A similar circuit can be provided also to dissipate negative going transients. An identical circuit as in FIG. 2 could be provided across the switch 1 but having a comparator 8 which turns on when the voltage at its input goes below a negative reference value. Alternatively, the same further electronic switch 12 can be used and a further comparator 8' can be provided which switches on the further electronic switch 12 in the event the transient pulse goes below a preset negative reference value (FIG. 5).

Figure 3:
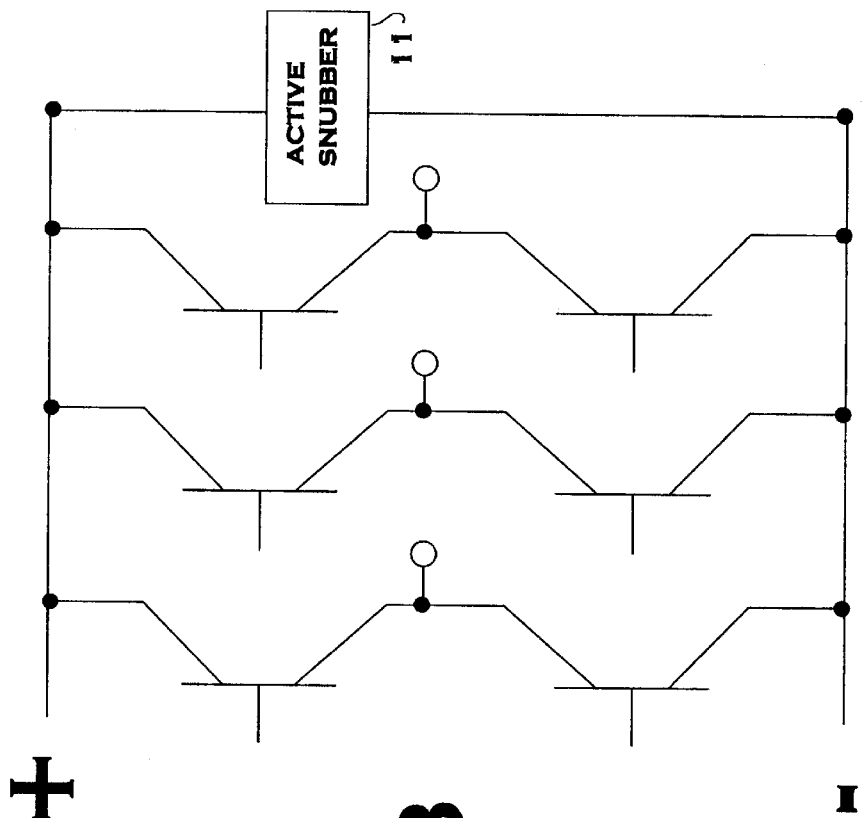
FIG. 3 shows that the active device snubber circuit according to the invention can be coupled across a plurality of devices to be protected.

The active snubber device of the invention does not need to be connected directly across a device to be protected or across only one device to be protected. It can be connected directly across any two points that require protection, e.g. across the dc terminals of a complete 3 phase bridge. FIG. 3 shows such an arrangement.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. A snubber device for a power switch comprising:

a comparator circuit for coupling to the power switch, the comparator having a reference voltage input for receiving a predetermined reference voltage and a sensed voltage input for receiving a voltage across the power switch, the comparator circuit producing a control signal which changes state when the sensed voltage rises substantially above or falls substantially below the predetermined reference voltage; and an electronic switch for coupling across the power switch and receiving the control signal of the comparator circuit such that the electronic switch turns on when the comparator circuit detects that a magnitude of the voltage across the power switch has either risen substantially above or fallen substantially below the predetermined reference voltage, thereby completing a shunt circuit across the power switch to at least partially reduce the voltage across the power switch.

2. The device of claim 1, further comprising a resistance in series with the electronic switch for dissipating energy such that the voltage across the power switch reduces when the comparator circuit detects that a magnitude of the voltage across the power switch has either risen substantially above or fallen substantially below the predetermined reference voltage.

3. The device of claim 2, further comprising a capacitor coupled in parallel with the resistance.

4. The device of claim 3, further comprising a resistor coupled in series with the parallelled capacitor and resistance.

5. The device of claim 1, wherein the electronic switch comprises an IGBT.

6. The device of claim 1, wherein the voltage across the power switch is susceptible to positive going transient voltage pulses, the electronic switch completing a shunt circuit across the power switch to at least partially reduce the positive going transient voltage when the comparator circuit detects that the voltage across the power switch has risen substantially above the predetermined reference voltage.

7. The device of claim 1, wherein the voltage across the power switch is susceptible to negative going transient voltage pulses, the electronic switch completing a shunt circuit across the power switch to at least partially reduce the negative going transient voltage when the comparator circuit detects that the voltage across the power switch has fallen substantially below the predetermined reference voltage.

8. The device of claim 1, wherein the snubber device is coupled across a plurality of power switches.

9. A snubber device for a power switch comprising:

a first comparator for coupling to the power switch, the first comparator having a first reference voltage input for receiving a first predetermined reference voltage and a first sensed voltage input for receiving a voltage across the power switch, the first comparator producing a first control signal at an active state when the first sensed voltage rises substantially above the first predetermined reference voltage;

a second comparator for coupling to the power switch, the second comparator having a second reference voltage input for receiving a second predetermined reference voltage and a second sensed voltage input for receiving a voltage across the power switch, the second comparator producing a second control signal at an active state when the second sensed voltage falls substantially below the second predetermined reference voltage; and an electronic switch for coupling across the power switch and receiving the first and second control signals from the first and second comparators such that the electronic switch turns on when either of the first and second control signals are in the active state, thereby completing a shunt circuit across the power switch to at least partially reduce the voltage across the power switch.

10. The device of claim 9, further comprising a resistance in series with the electronic switch for dissipating energy such that the voltage across the power switch reduces when either of the first and second control signals are in the active state.

11. The device of claim 10, further comprising a capacitor coupled in parallel with the resistance.

12. The device of claim 11, further comprising a resistor coupled in series with the parallelled capacitor and resistance.

13. The device of claim 9, wherein the electronic switch comprises an IGBT.

14. The device of claim 9, wherein the voltage across the power switch is susceptible to positive going transient voltage pulses and negative going transient voltage pulses, the electronic switch completing a shunt circuit across the power switch to at least partially reduce the positive or negative going transient voltage when the respective first or second control signal is at the active state.

15. The device of claim 14, wherein the first predetermined reference voltage is a positive voltage and the second predetermined reference voltage is a negative voltage.

16. A snubber device for an electronic circuit comprising:

a comparator circuit for coupling to the electronic circuit, the comparator circuit having a reference voltage input for receiving a predetermined reference voltage and a sensed voltage input for receiving a voltage from the electronic circuit, the comparator circuit producing a control signal which changes state when the sensed voltage rises substantially above or falls substantially below the predetermined reference voltage; and an electronic switch for coupling to the electronic circuit and receiving the control signal of the comparator circuit such that the electronic switch turns on when the comparator circuit detects that a magnitude of the sensed voltage has either risen substantially above or fallen substantially below the predetermined reference voltage, thereby completing a shunt circuit from the electronic circuit to a fixed potential to at least partially reduce the voltage from the electronic circuit.

* * * * *